United States Patent
Takemura

(10) Patent No.: US 8,902,637 B2
(45) Date of Patent: Dec. 2, 2014

(54) SEMICONDUCTOR MEMORY DEVICE COMPRISING INVERTING AMPLIFIER CIRCUIT AND DRIVING METHOD THEREOF

(75) Inventor: Yasuhiko Takemura, Kanagawa (JP)

(73) Assignee: Semiconductor Energy Laboratory Co., Ltd., Atsugi-shi, Kanagawa-ken (JP), `

( * ) Notice: Subject to any disclaimer, the term of this patent is extended or adjusted under 35 U.S.C. 154(b) by 199 days.

(21) Appl. No.: 13/288,089

(22) Filed: Nov. 3, 2011

(65) Prior Publication Data

US 2012/0113707 A1 May 10, 2012

(30) Foreign Application Priority Data

Nov. 8, 2010 (JP) ................. 2010-249435

(51) Int. Cl.
G11C 11/24 (2006.01)
G11C 16/02 (2006.01)
G11C 11/404 (2006.01)
G11C 11/405 (2006.01)

(52) U.S. Cl.
CPC .............. *G11C 11/404* (2013.01); *G11C 16/02* (2013.01); *G11C 11/405* (2013.01)
USPC ........................................................ 365/149

(58) Field of Classification Search
USPC ...................... 365/149, 102, 49.12
See application file for complete search history.

(56) References Cited

U.S. PATENT DOCUMENTS

| 4,466,081 | A |   | 8/1984  | Masuoka  |         |
|-----------|---|---|---------|----------|---------|
| 5,367,481 | A | * | 11/1994 | Takase et al. | 365/149 |
| 5,535,170 | A | * | 7/1996  | Imamura et al. | 365/239 |
| 5,731,856 | A |   | 3/1998  | Kim et al. |       |
| 5,744,844 | A |   | 4/1998  | Higuchi  |         |

(Continued)

FOREIGN PATENT DOCUMENTS

EP   1 737 044 A1   12/2006
EP   2 226 847 A2    9/2010

(Continued)

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

(Continued)

*Primary Examiner* — Vanthu Nguyen
*Assistant Examiner* — Khamdan Alrobaie
(74) *Attorney, Agent, or Firm* — Fish & Richardson P.C.

(57) ABSTRACT

A novel semiconductor memory device whose power consumption is low is provided. A source of a writing transistor WTr_n_m, a gate of a reading transistor RTr_n_m, and one electrode of a capacitor CS_n_m are connected to each other. A gate and a drain of the writing transistor WTr_n_m are connected to a writing word line WWL_n and a writing bit line WBL_m, respectively. The other electrode of the capacitor CS_n_m is connected to a reading word line RWL_n. A drain of the reading transistor RTr_n_m is connected to a reading bit line RBL_m. Here, the potential of the reading bit line RBL_m is input to an inverting amplifier circuit such as a flip-flop circuit FF_m to be inverted by the inverting amplifier circuit. This inverted potential is output to the writing bit line WBL_m.

6 Claims, 10 Drawing Sheets

(56) References Cited

U.S. PATENT DOCUMENTS

| | | |
|---|---|---|
| 5,744,864 A | 4/1998 | Cillessen et al. |
| 5,936,881 A * | 8/1999 | Kawashima et al. ......... 365/149 |
| 6,127,702 A | 10/2000 | Yamazaki et al. |
| 6,294,274 B1 | 9/2001 | Kawazoe et al. |
| 6,314,017 B1 * | 11/2001 | Emori et al. ................. 365/149 |
| 6,445,026 B1 | 9/2002 | Kubota et al. |
| 6,536,013 B2 | 3/2003 | Kobayashi et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,859,889 B2 | 12/2010 | Kameshiro et al. |
| 7,935,582 B2 | 5/2011 | Iwasaki |
| 7,956,361 B2 | 6/2011 | Iwasaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0128803 A1 | 6/2005 | Luk et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0137394 A1 * | 6/2008 | Shimano et al. ................ 365/72 |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2011/0101334 A1 | 5/2011 | Yamazaki et al. |
| 2011/0175087 A1 * | 7/2011 | Yamazaki et al. ............... 257/57 |
| 2011/0260158 A1 * | 10/2011 | Takemura ....................... 257/43 |

FOREIGN PATENT DOCUMENTS

| | | |
|---|---|---|
| JP | 56-162875 A | 12/1981 |
| JP | 60-198861 A | 10/1985 |
| JP | 62-230043 A | 10/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-053164 A | 2/2001 |
| JP | 2002-076356 A | 3/2002 |
| JP | 2002-093924 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |
| WO | 2007/029844 A1 | 3/2007 |

OTHER PUBLICATIONS

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

(56) References Cited

OTHER PUBLICATIONS

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al.. "Novel Top-Gate Zinc Oxide Thin-Film Transistors (ZnO TFTs) for AMLCDS," Journal of the SID , 2007, vol. 15, No. 1, pp. 17-22.
Ikeda., T et al.. "Full-Functional System Liquid Crystal Display Using CG-Silicon Technology," SID Digest '04 : SID International Symposium Digest of Technical Papers, 2004, vol. 35, pp. 860-863.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Kimizuka, N et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.
Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.
Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.
Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Park, J et al., "Amorphous Indium—Gallium—Zinc Oxide TFTs and Their Application for Large Size AMOLED." AM-FPD '08 Digest of Technical Papers, Jul. 2, 2008, pp. 275-278.
Park, S et al., "Challenge to Future Displays: Transparent AM-OLED Driven by Peald Grown ZnO TFT," IMID '07 Digest, 2007, pp. 1249-1252.
Sakata, J et al., "Development of 4.0-in. AMOLED Display With Driver Circuit Using Amorphous In—Ga—Zn—Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Ueno, K et al., "Field-Effect Transistor on SrTiO3 With Sputtered Al2O3 Gate Insulator," Appl. Phys. Lett. (Applied Physics Letters), Sep. 1. 2003, vol. 83, No. 9, pp. 1755-1757.
Kimura Kim; "Technology for sub-50nm DRAM and NAND Flash Manufacturing"; IEDM 05: Technical Digest of International Electron Devices Meeting; Dec. 5, 2005; pp. 333-336.
W. Mueller et al.; "Challenges for the DRAM Cell Scaling to 40nm"; IEDM 05: Technical Digest of International Electron Devices Meeting; 2005; pp. 347-350.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and SN-Doped Zinc Indium Oxide Thin Film Transistors for Amoled Back-Plane," SID Digest '09 : SID International Symposium Digest of Technical Papers, May 31, 2009, pp. 280-283.
Clark, S et al., "First Principles Methods Using Castep," Zeitschrift fur Kristallographie, 2005, vol. 220, pp. 567-570.
Coates, D et al., Optical Studies of the Amorphous Liquid-Cholesteric Liquid Crystal Transition: the "Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In-Ga-Zn-0 TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.
Godo, H et al., "Temperature Dependence of Characteristics and Electronic Structure fo Amorphous In-Ga-Zn-Oxide TFT," AM-FPD '09 Digest of Technical Papers, Jul. 1, 2009, pp. 41-44.
Hayashi, R et al., "42.1: Invited Paper: improved Amorphous In-Ga-Zn-O TFTs," SID Digest '08 : SID International Symposium Digest of Technical Papers, May 20, 2008, vol. 39, pp. 621-624.

(56) References Cited

OTHER PUBLICATIONS

Hirao, T et al., "Novel Top-Gate Zinc Oxide Thin-Film Transistors (ZNO TFTs) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA Amoled Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," the Electrochemical Society, 214TH ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures.Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m =3, 4, and 5), InGaO3(ZnO)3, and Ga2O3(ZnO)m (m =7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of Am-Oled," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., C et al. "Modulated Structures of Homologous Compounds InMO3(ZnO)m (M=in,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size Amoled Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C, " Journal of Solid Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(Zn0)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem Oleds," SID Digest '09 : SID International Symposium Digest of Technical Papers, May 31, 2009, vol. 40, pp. 899-902.

Oba, F et al., "Defect energetics in ZnO: A Hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA Amoled Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA Amoled Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

(56) References Cited

OTHER PUBLICATIONS

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission Am-Oled Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size Amoled." AM-FPD'08 Digest of Technical Papers, Jul. 2, 2008, pp. 275-278.

Park, S et al., "Challenge to Future Displays: Transparent Am-Oled Driven by Peald Grown ZnO TFT," IMID'07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. Amoled Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA Amoled Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

van de Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

SEMICONDUCTOR MEMORY DEVICE COMPRISING INVERTING AMPLIFIER CIRCUIT AND DRIVING METHOD THEREOF

BACKGROUND OF THE INVENTION

1. Field of the Invention

The present invention relates to a memory device including a semiconductor.

2. Description of the Related Art

As a memory device including a semiconductor, which is used in various electronic products and electronics products, a dynamic random access memory (DRAM), a static random access memory (SRAM), and the like can be given.

In a DRAM, data is stored by holding charge in a capacitor which is provided in a memory cell. However, even when a transistor used for switching is in an off state, a slight amount of leakage current is generated between a source and a drain; thus, the data is lost within a relatively short time (several tens of seconds at the longest). Therefore, the data needs to be rewritten (refreshed) on a regular cycle (generally once every several tens of milliseconds), and power consumption is high even in a standby period.

While miniaturization of a circuit has been attempted, a deep hole (a trench) or a chimney-like projection (a stack) is formed to function as a capacitor because the capacitance of the capacitor needs to be kept constant (generally, 10 fF or higher). With the miniaturization, the aspect ratio thereof (the ratio of height or depth to base) has become 50 or more. A special technique for forming such a structure has been needed (see Non-Patent Document 1 and Non-Patent Document 2).

In an SRAM, data is held by utilizing a bistable state of a flip-flop circuit. When a CMOS inverter (a complementary inverter) is used in a flip-flop circuit of an SRAM, the amount of power consumption in a standby period is significantly smaller than that of a DRAM (see Patent Document 1). Therefore, an SRAM is used instead of a DRAM for applications, e.g., a cellular phone, in which the frequency of data writing and data reading is not so high and a standby period is much longer than a period during which data writing and data reading are performed. However, since six transistors are used in one memory cell, the degree of integration is lower than that of a DRAM and the unit cost per bit is ten times or more as high as that of the DRAM.

In recent years, a transistor in which the amount of leakage current between a source and a drain in an off state is extremely small and which has excellent charge holding characteristics has been devised, and a memory cell using it has been proposed (see Patent Document 2). In the case where a transistor of this structure is used, two transistors are needed for one memory cell; however, a capacitor having large capacitance is not needed unlike in a DRAM. In addition, data can be held for an extremely long period without refresh operation.

REFERENCE

Patent Document

[Patent Document 1] U.S. Pat. No. 5,744,844
[Patent Document 2] United States Patent Application Publication No. 2011/0101334

Non-Patent Document

[Non-Patent Document 1] K. Kim, "Technology for sub-50 nm DRAM and NAND flash manufacturing", *Technical Digest of International Electron Devices Meeting*, pp. 333-336, 2005.

[Non-Patent Document 2] W. Mueller et al., "Challenges for the DRAM cell scaling to 40 nm", *Technical Digest of International Electron Devices Meeting*, pp. 347-350, 2005.

SUMMARY OF THE INVENTION

It is an object of the present invention to provide a novel semiconductor device (particularly, a semiconductor memory device). It is another object to provide a driving method of a novel semiconductor device (particularly, a driving method of a semiconductor memory device). Further, it is another object to provide a manufacturing method of a novel semiconductor device (particularly, a manufacturing method of a semiconductor memory device).

According to the present invention, a semiconductor memory device whose power consumption per bit in a standby period is lower than that of a DRAM and whose degree of integration is higher than that of an SRAM, a memory cell used in the semiconductor memory device, driving methods thereof, and manufacturing methods thereof are provided.

In addition, according to the present invention, a memory cell in which three or less transistors are used and which consumes a current of $1 \times 10^{-20}$ A or less in a standby period, and a semiconductor device including such a memory cell are provided. According to the present invention, at least one of the above objects is achieved.

The present invention will be described below; terms used in this specification are briefly described. First, when one of a source and a drain of a transistor is called a drain, the other is called a source in this specification. That is, they are not distinguished depending on the potential level. Therefore, a portion called a source in this specification can be alternatively referred to as a drain.

Even when the expression "to be connected" is used in this specification, there is a case in which no physical connecting portion is formed and a wiring is only extended in an actual circuit. For example, in a circuit including a field-effect transistor (FET), one wiring functions as gates of a plurality of FETs in some cases. In that case, one wiring having a plurality of branches may be illustrated in a circuit diagram. Even in such a case, the expression "a wiring is connected to a gate" may be used in this specification.

Note that in this specification, in referring to a specific row, a specific column, or a specific position in a matrix, a reference sign is accompanied in some cases by a sign denoting a coordinate as follows, for example: "a writing transistor WTr_n_m", "a bit line BL_m", and "a writing word line WWL_n". In the case where a row, a column, or a position is not specified, the case where elements are collectively referred to, or the case where the position is obvious, the following expressions may be used: "a writing transistor WTr", "a bit line BL", and "a writing word line WWL" or simply "a writing transistor", "a bit line", and "a writing word line".

The expression "the potential of a word line is set to H" (or "the potential of a word line is set to L") means that the potential of the word line is set to a potential at which a transistor whose gate is connected to the word line is turned on (or turned off).

In one embodiment of the present invention, one memory cell includes a transistor as a writing transistor, in which leakage current between a source and a drain in an off state is small, another transistor (a reading transistor), and a capacitor. Further, as wirings connected to these, four kinds of wirings, that is, a writing word line, a writing bit line, a reading word line, and a reading bit line, are prepared.

The source of the writing transistor is connected to a gate of the reading transistor and one electrode of the capacitor. In a portion where they are connected to each other, charge can be transferred only through the writing transistor; when the writing transistor is off, the portion is insulated from its periphery and charge is confined therein. Therefore, this portion is referred to as a floating node, and a portion of the gate of the reading transistor is particularly referred to as a floating gate.

In addition, a gate of the writing transistor is connected to the writing word line. The drain of the writing transistor is connected to the writing bit line. A drain of the reading transistor is connected to the reading bit line. The other electrode of the capacitor is connected to the reading word line.

Note that a source of the reading transistor is supplied with an appropriate potential by another wiring. Depending on the reading method, a fluctuation in this potential can be small. For example, a driving method by which a constant potential can be held for 1 second or longer can be employed. Therefore, the resistance of the wiring connected to the source of the reading transistor does not necessarily need to be low. For example, silicon which is doped with impurities, or silicon which is doped with impurities and has a surface where silicide is formed may be used.

As the writing transistor, a transistor in which current flowing between a source and a drain can be $1 \times 10^{-21}$ A or less, preferably $1 \times 10^{-24}$ A or less at ambient temperature when the transistor is in use (e.g., 25° C.), or can be $1 \times 10^{-20}$ A or less, preferably $1 \times 10^{-23}$ A or less at 85° C. by adjusting the potential of a gate is preferably used. Under such conditions, the capacitance of the capacitor can be much smaller than that of a conventional DRAM. In addition, the interval between refresh operations, which are necessary in a conventional DRAM, can be significantly long, and the refresh operation can be substantially unnecessary.

For example, even when the capacitance of the capacitor is 0.01 fF, which is 1/1000 or less of that of a conventional DRAM, the time constant is $1 \times 10^7$ seconds (115 days) in the case where current flowing between the source and the drain is $1 \times 10^{-24}$ A. Thus, data can be held for a long period, which cannot be assumed in a conventional DRAM. That is, in using a usual personal computer, the refresh operation may be regarded as unnecessary, or the refresh operation may be performed at least once every ten days.

In other words, refresh operation (rewriting of data for the purpose of compensating a reduction in charge accumulated in a capacitor) which needs to be performed ten or more times per second in a conventional DRAM becomes unnecessary in a usual usage.

In the case of a general silicon semiconductor, it is difficult to realize leakage current having such a small value; however, such a value can be achieved in a transistor in which a semiconductor whose band gap is 2.8 electron volts (eV) or more (i.e., a wide bandgap semiconductor), such as an oxide semiconductor, is processed under a preferable condition. Therefore, a wide bandgap semiconductor is preferably used as a material for the writing transistor. Needless to say, in the present invention, a silicon semiconductor is not excluded from examples of a semiconductor used for the writing transistor.

Although a variety of known materials can be used as the oxide semiconductor, a material with a bandgap greater than or equal to 3 eV and less than 3.6 eV is desirable. In addition, it is desirable to use a material with an electron affinity greater than or equal to 4 eV, preferably a material with an electron affinity greater than or equal to 4 eV and less than 4.9 eV. In particular, an oxide including gallium and indium is preferable for the object of the present invention. Among such materials, a material whose carrier concentration derived from a donor or an acceptor is less than $1 \times 10^{-14}$ cm$^{-3}$, preferably less than $1 \times 10^{-11}$ cm$^{-3}$ is desirable.

As for the reading transistor, although there is no particular limitation on the leakage current between the source and the drain in an off state, smaller leakage current is preferable because power consumption can be reduced. Further, a transistor which operates at high speed is desirable in order to increase the reading speed. Specifically, it is preferable to use a transistor with a switching speed of 10 nanoseconds or less.

Further, in both the writing transistor and the reading transistor, gate leakage current (leakage current between the gate and the source or between the gate and the drain) needs to be extremely small. Also in the capacitor, internal leakage current (leakage current between the electrodes) needs to be small. Each leakage current may be $1 \times 10^{-21}$ A or less, preferably $1 \times 10^{-24}$ A or less at ambient temperature when the transistor or the capacitor is in use (e.g., 25° C.).

The potential of the gate (floating node) of the reading transistor is changed according to the potential of the reading word line. As a result, the gate capacitance of the reading transistor is changed. That is, the gate capacitance of the reading transistor in the case where the reading transistor is in an on state is larger than that in the case where the reading transistor is in an off state. When change in the gate capacitance of the reading transistor is larger than the capacitance of the capacitor, a problem is caused in operation of the memory cell in some cases.

Therefore, the capacitance of the capacitor is preferably larger than or equal to the gate capacitance of the reading transistor, further preferably larger than or equal to twice as large as the gate capacitance of the reading transistor. For this, the permittivity of a dielectric of the capacitor is preferably larger than that of a gate insulator of the reading transistor. Note that in the case where the dielectric of the capacitor and a gate insulator of the writing transistor are formed of the same material, there is an advantageous effect of improving the current driving capability of the writing transistor with the use of such a material having high permittivity.

To the reading word line, many capacitors are connected in parallel in this manner; thus, the capacitance of the reading word line is increased, which does not lead to a problem in many cases. The reason is as follows. Since the capacitance connected to the reading word line corresponds to the capacitance of the capacitor and the gate capacitance of the reading transistor which are connected in series, the combined capacitance is always smaller than the smaller one (under the above condition, the gate capacitance of the reading transistor).

Note that in a miniaturized semiconductor circuit, in order to form a capacitor without manufacturing a special structure having an extremely large aspect ratio, the capacitance of the capacitor is preferably 1 fF or less, more preferably 0.1 fF or less if possible. However, the capacitance may be 1 fF or more because the capacitance is preferably large in order to reduce the probability of data fluctuation due to a soft error.

Note that in the above structure, a fluctuation in charge of the capacitor due to a soft error is caused by the writing transistor. However, when a semiconductor layer of the writing transistor has a small thickness of 50 nm or less, the probability of charge fluctuation due to a soft error can be negligible even when the capacitance of the capacitor is 0.1 fF or less. Therefore, when the semiconductor layer used in the writing transistor has a thickness of 50 nm or less, reliability can be maintained even in the case where the capacitance of the capacitor is 0.1 fF or less.

Note that in order to suppress a short-channel effect of the writing transistor, the semiconductor layer is preferably thin. When the channel length of the writing transistor, the thickness of the gate insulator, the permittivity of the gate insulator, the thickness of the semiconductor layer, and the permittivity of the semiconductor layer are expressed as L, $t_1$, $\in_1$, $t_2$, and $\in_2$, respectively, $L/5>(\in_2 t_1/\in_1+t_2)$ is preferably satisfied. For example, in the case where L=100 nm, $t_1$=10 nm, and $\in_1=\in_2$ are satisfied, $t_2$ is preferably less than 10 nm. When the semiconductor layer is thin in such a manner, a soft error described above can be prevented.

The writing word line, the writing bit line, the reading word line, and the reading bit line are arranged in a matrix. In order to perform matrix driving, it is preferable that the writing word line and the writing bit line be orthogonal, the writing word line and the reading word line be in parallel, and the writing bit line and the reading bit line be in parallel.

That is, one writing word line and one reading word line are needed per row in a matrix, and one writing bit line and one reading bit line are needed per column in a matrix. Therefore, for a matrix with N rows and M columns (N and M are natural numbers of 2 or more) of a memory device, at least (2N+2M) wirings are necessary. In addition, a wiring connected to the source of the reading transistor RTr is needed.

Some of these wiring are formed so as to have a three-dimensional structure, whereby the area occupied by the wirings can be reduced. For example, the wiring connected to the source of the reading transistor RTr is formed so as to overlap with the writing word line or the reading word line, or formed between the writing word line and the reading word line, whereby the memory cell can be formed without changing the practical area of the memory cell.

The reading transistor and the writing transistor may be formed in different layers. Note that a structure in which a writing word line for one memory cell functions also as a reading word line for another memory cell, or a structure in which a writing bit line for one memory cell functions also as a reading bit line for another memory cell is employed, whereby the number of necessary wirings can be reduced.

In such a memory cell, data writing is performed in the following manner: the potential of the writing word line is set to H so that the writing transistor is turned on, and charge corresponding to the potential of the writing bit line is supplied to the capacitor of the memory cell.

Writing transistors of a large number of memory cells are connected to the writing word line. In some cases, data needs to be written to some memory cells, and does not need to be written to the other memory cells. When the potential of the writing word line is set to H, all the writing transistors connected to the same writing word line are turned on so that there is a possibility that data of the memory cell for which data writing is unnecessary is rewritten to false one.

In order to prevent this, data reading operation is performed before data writing. Data is read to be output to the reading bit line, and that data has a phase opposite to that of held data. That is, in the case where data "1" is held, data to be output to the reading bit line corresponds to data "0".

Output from the reading bit line is inverted by an inverting amplifier circuit such as an inverter circuit or a flip-flop circuit. That is, in the case where data output from the reading bit line corresponds to data "0", output from the inverter circuit or output from another input terminal of the flip-flop circuit (these are collectively referred to as output from the inverting amplifier circuit) corresponds to data "1".

If data of the memory cell does not need to be rewritten, output from the inverting amplifier circuit is output to the writing bit line. As described above, output from the inverting amplifier circuit has the same phase as data which is initially held.

In this state, when the potential of the writing word line is set to H so that the writing transistor is turned on, the potential of the source of the writing transistor has the same phase as the potential of the writing bit line. That is, data which is equivalent to initially stored one is written. As a result, "data is not rewritten".

Note that in the case where data of the memory cell needs to be rewritten, the data to be rewritten is output to the writing bit line and the writing transistor is turned on by setting the potential of the writing word line to H.

One embodiment of the present invention is a semiconductor memory device including one or more writing bit lines; one or more writing word lines; one or more reading bit lines; one or more reading word lines; one or more memory cells; and a mechanism in which a potential of each one of the reading bit lines is inverted and amplified to be supplied to corresponding one of the writing bit lines. Each of the memory cells includes a writing transistor, a reading transistor, and a capacitor. A source of the writing transistor, a gate of the reading transistor, and one electrode of the capacitor are connected to each other. A drain of the writing transistor is connected to one of the writing bit lines. A gate of the writing transistor is connected to one of the writing word lines. A drain of the reading transistor is connected to one of the reading bit lines. The other electrode of the capacitor is connected to one of the reading word lines.

Another embodiment of the present invention is a semiconductor memory device including two or more bit lines; two or more word lines; one or more memory cells; and a mechanism in which a potential of one of the bit lines is inverted and amplified to be supplied to another one of the bit lines. Each of the memory cells includes a writing transistor, a reading transistor, and a capacitor. A source of the writing transistor, a gate of the reading transistor, and one electrode of the capacitor are connected to each other. A drain of the writing transistor is connected to one of the bit lines. A gate of the writing transistor is connected to one of the word lines. A drain of the reading transistor is connected to another one of the bit lines. The other electrode of the capacitor is connected to another one of the word lines.

Another embodiment of the present invention is a driving method of the above semiconductor memory device, including the steps of charging the writing bit line and the reading bit line to different potentials; changing a potential of the reading word line; and outputting a potential whose phase is opposite to a phase of a potential of the reading bit line to the writing bit line with an inverting amplifier circuit.

In the above memory cell, the resistance of the writing transistor is extremely high in an off state; thus, charge accumulated in the capacitor is held for a sufficiently long period, so that frequent refresh operation is unnecessary unlike in a conventional DRAM. For example, when current flowing between the source and the drain in the writing transistor in an off state is $1\times10^{-26}$ A and the capacitance of the capacitor is 0.01 fF, charge can be held for 10 years or more.

When the potential of the reading bit line and that of the source of the reading transistor in a standby period are the same, power consumption of this portion is ideally 0 W. Further, as described above, leakage current through the capacitor is sufficiently low. Therefore, current consumed by one memory cell in a standby period can be $1\times10^{-20}$ A or less.

Further, as apparent from the above description, the number of transistors used in one memory cell is three or less, typically two. These are provided in different layers, whereby the area occupied by the memory cells can be reduced. Furthermore, as described above, the wirings are arranged so as to have a three-dimensional structure or the wiring is shared by different elements, whereby the number of wirings can be reduced. Consequently, the degree of integration can be further increased.

Note that even in the case where current flowing between the source and the drain in the writing transistor in an off state is not extremely low as described above, a semiconductor memory device whose degree of integration is sufficiently high can be manufactured as described in the following embodiments. In this semiconductor memory device, a capacitor having large capacitance is unnecessary unlike in a DRAM and a soft error does not easily occur.

DETAILED DESCRIPTION OF THE INVENTION

Hereinafter, embodiments will be described with reference to the drawings. Note that the embodiments can be implemented in various modes, and it is easily understood by those skilled in the art that modes and details can be changed in various ways without departing from the spirit and scope of the present invention. Therefore, the present invention is not construed as being limited to the description of the embodiments below.

Note that specific values of potentials are given below for the purpose of aid for understanding a technical idea of the present invention. Needless to say, such values are changed depending on various characteristics of a transistor, a capacitor, or the like, or for convenience of the practitioner. Further, in the semiconductor memory device described in the embodiments, data can be written or read using a method other than a method described below.

For the purpose of aid for understanding, in some circuit diagrams, a cross mark on a transistor indicates that the transistor is in an off state, and a circle on a transistor indicates that the transistor is in an on state.

Embodiment 1

Figure 1A:
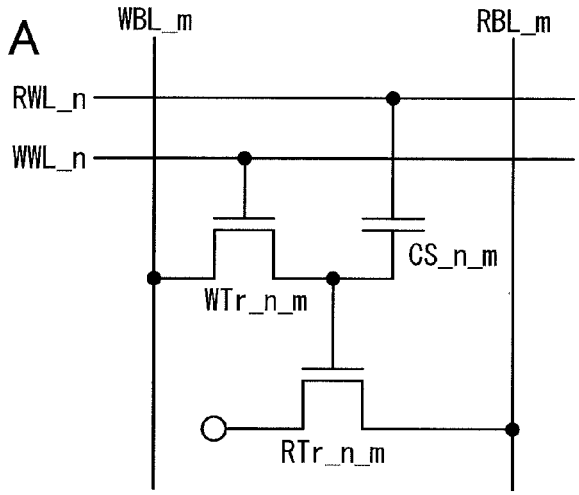
FIGS. 1A to 1E illustrate an example of a semiconductor memory device according to the present invention and an example of a driving method thereof.
Figure 1B:
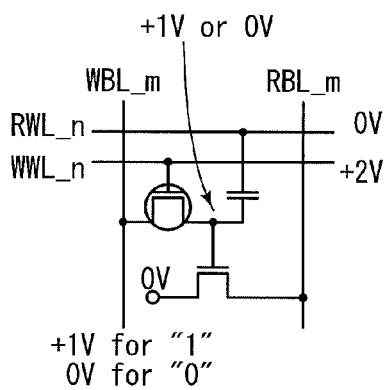

FIG. 1A illustrates a memory cell of this embodiment. Here, n and m are natural numbers of 1 or more. In FIG. 1A, a memory cell including a writing transistor WTr_n_m, a reading transistor RTr_n_m, and a capacitor CS_n_m is illustrated. Here, a source of the writing transistor WTr_n_m is connected to a gate of the reading transistor RTr_n_m and one electrode of the capacitor CS_n_m.

In the memory cell illustrated in FIG. 1A, the writing transistor WTr_n_m and the reading transistor RTr_n_m are each an n-channel transistor; however, without limitation to this, the following structures can be employed, for example: the writing transistor WTr_n_m and the reading transistor RTr_n_m are each a p-channel transistor; the writing transistor WTr_n_m and the reading transistor RTr_n_m are an n-channel transistor and a p-channel transistor, respectively; and the writing transistor WTr_n_m and the reading transistor RTr_n_m are a p-channel transistor and an n-channel transistor, respectively. Note that when the conductivity type of the transistor is changed, the potentials of a gate, a source, and a drain need to be changed accordingly.

A writing word line WWL_n and a reading word line RWL_n are in parallel, and a writing bit line WBL_m and a reading bit line RBL_m are in parallel. The writing word line WWL_n and the writing bit line WBL_m intersect with each other to form a matrix.

A gate of the writing transistor WTr_n_m is connected to the writing word line WWL_n, a drain of the writing transistor WTr_n_m is connected to the writing bit line WBL_m, a drain of the reading transistor RTr_n_m is connected to the reading bit line RBL_m, and the other electrode of the capacitor CS_n_m is connected to the reading word line RWL_n.

The potential of a source of the reading transistor RTr_n_m is held at a fixed potential (here, 0 V). Further, the potential of the writing bit line WBL_m and that of the reading bit line RBL_m are each 0 V or more. Note that here, the threshold value of the writing transistor WTr_n_m is assumed to be +1 V, and that of the reading transistor RTr_n_m is assumed to be +0.5 V.

In the memory cell illustrated in FIG. 1A, the potential of the writing word line WWL_n is set to H, whereby the writing transistor WTr_n_m is turned on. By the potential of the writing bit line WBL_m at this time, charge is injected into the capacitor CS_n_m. The amount of charge injected at this time is determined depending on the potential of the writing bit line WBL_m, the gate capacitance of the reading transistor RTr_n_m, the capacitance of the capacitor CS_n_m, and the like and the result is thus always almost the same in the case where the conditions are the same, and dispersion is small. In this manner, data is written.

Then, the potential of the writing word line WWL_n is set to L, whereby the writing transistor WTr_n_m is turned off. At this time, current flowing between the source and the drain of the writing transistor WTr_n_m is set to $1 \times 10^{-21}$ A or less, preferably $1 \times 10^{-24}$ A or less, whereby charge in the capacitor CS_n_m can be held for an extremely long period.

At the time of data reading, an appropriate potential is applied to the reading word line RWL_n, and the state of the reading transistor RTr_n_m is monitored; thus, the written data can be found. Hereinafter, a specific example of data writing and data reading will be described with reference to FIGS. 1B to 1E.

In the following example, the gate capacitance of the reading transistor RTr is treated as much smaller than the capacitance of the capacitor CS. Therefore, in the case where the writing transistor WTr_n_m is off, when the potential of the reading word line RWL_n is decreased by 1 V, the potential of the gate of the reading transistor RTr_n_m is decreased by 1 V regardless of the state of the reading transistor RTr_n_m.

First, an example of a writing method will be described. The potential of the writing word line WWL_n is assumed to be +2 V, and the potential of the reading word line RWL_n is assumed to be 0 V. In the case where data "1" is written, the potential of the writing bit line WBL_m is set to +1 V. In the case where data "0" is written, the potential of the writing bit line WBL_m is set to 0 V. With this operation, the writing transistor WTr_n_m is turned on, and charge is accumulated in the capacitor CS_n_m (see FIG. 1B).

Note that at this time, when the potential of the reading bit line RBL_m is kept at 0 V, current does not flow between the source and the drain of the reading transistor RTr_n_m regardless of data to be written, which is effective for reducing power consumption. In a similar manner, when the potential of the reading bit line RBL_m is set to a potential whose phase is opposite to that of the potential of the writing bit line WBL_m (i.e., the potential of the reading bit line RBL_m is set to 0 V when the potential of the writing bit line WBL_m is +1 V, and the potential of the reading bit line RBL_m is set to +1 V when the potential of the writing bit line WBL_m is 0 V), current does not flow between the source and the drain of the reading transistor RTr_n_m.

After that, the potential of the writing word line WWL_n is set to −1 V, and in addition, the potential of the reading word line RWL_n is set to −1 V. With this operation, the writing transistor WTr_n_m is turned off, and charge in the capacitor CS_n_m is held. The potential of the gate of the reading transistor RTr_n_m (which is also the potential of the capacitor CS_n_m or the potential of the floating node) is decreased by 1 V from the written potential to 0 V or −1 V; thus, the reading transistor RTr_n_m is off regardless of written data.

Figure 1C:
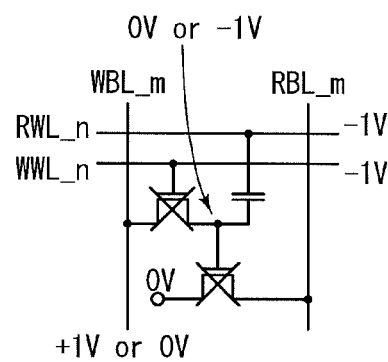
Figure 1D:
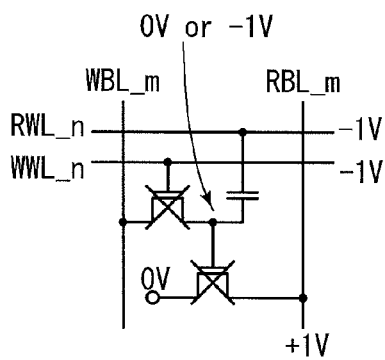
Figure 1E:
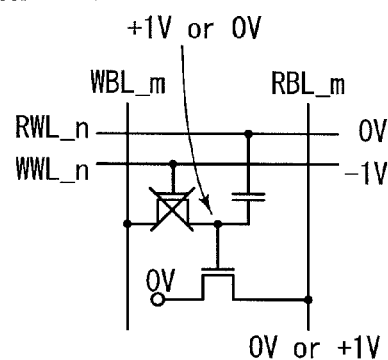

Note that the writing bit line WBL_m is supplied with data which is to be written to a memory cell in another row, so that the potential of the writing bit line WBL_m fluctuates between 0 V and +1 V (see FIG. 1C). In a similar manner, the potential of the reading bit line RBL_m fluctuates between 0 V and +1 V in some cases.

Next, an example of a reading method will be described. First, the reading bit line RBL_m is charged to +1 V (see FIG. 1D). Charging a wiring before one operation in this manner is referred to as pre-charge. Then, the potential of the reading word line RWL_n is set to 0 V (which is equal to that at the time of data writing). Then, according to written data, the potential of the gate of the reading transistor RTr_n_m becomes +1 V (when data "1" is written) or 0 V (when data "0" is written), or becomes a value close thereto. In the former case, the reading transistor RTr_n_m is turned on, and in the latter case, the reading transistor RTr_n_m remains off.

When the reading transistor RTr_n_m is turned on, charge in the reading bit line RBL_m is given to the source (having a potential of 0 V) of the reading transistor RTr_n_m; thus, the potential of the reading bit line RBL_m becomes 0 V. On the other hand, when the reading transistor RTr_n_m is off, the potential of the reading bit line RBL_m is kept at +1 V. Therefore, by measuring the potential of the reading bit line RBL_m, held data can be judged (see FIG. 1E).

Here, the phase of the potential of the reading bit line RBL_m is opposite to that of the writing bit line WBL_m at the time of data writing. That is, when data "0" (data "1") is written, the potential of the writing bit line WBL_m is set to 0 V (+1 V), and the potential of the reading bit line RBL_m at the time of reading data "0" (data "1") is +1 V (0 V). Note that since the writing transistor WTr_n_m is kept off during the above reading operation, charge accumulated in the capacitor CS_n_m is held.

Figure 2:
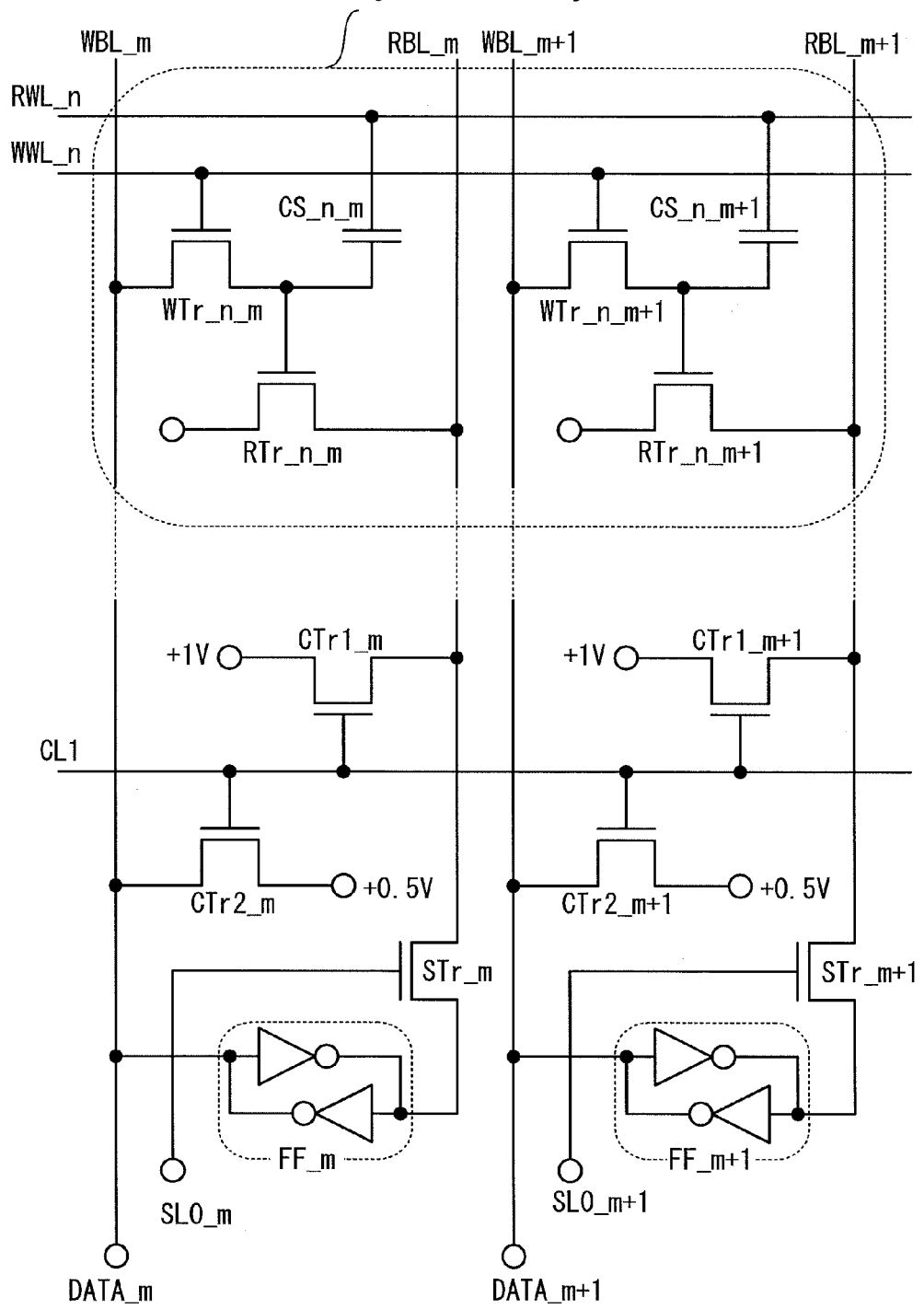
FIG. 2 illustrates an example of a semiconductor memory device according to the present invention.

FIG. 2 illustrates an example of a circuit for driving a memory cell array including a plurality of memory cells a structure of which is the same as that of the memory cell illustrated in FIG. 1A. In this circuit, a drain of a second pre-charge transistor CTr2_m is connected to a writing bit line WBL_m, and a drain of a first pre-charge transistor CTr1_m is connected to a reading bit line RBL_m. The potential of a source of the first pre-charge transistor CTr1_m is kept at +1 V, and a gate thereof is connected to a first pre-charge control line CL1. The potential of a source of the second pre-charge transistor CTr2_m is kept at +0.5 V, and a gate thereof is connected to the first pre-charge control line CL1.

That is, the potential of the first pre-charge control line CL1 is set to H, whereby the potential of the writing bit line WBL_m can be set to +0.5 V and the potential of the reading bit line RBL_m can be set to +1 V.

The reading bit line RBL_m is also connected to a drain of a selection transistor STr_m. A source of the selection transistor STr_m is connected to one input/output terminal of a flip-flop circuit FF_m, and a gate thereof is connected to a data selection line SL0_m. The potential of the data selection line SL0_m is set to H, whereby the selection transistor STr_m is turned on, and the potential of the reading bit line RBL_m can be input to the flip-flop circuit FF_m.

The other input/output terminal of the flip-flop circuit FF_m is connected to the writing bit line WBL_m. Note that the high power supply potential of the flip-flop circuit FF_m is assumed to be +1 V and the low power supply potential thereof is assumed to be 0 V. The writing bit line WBL_m is also connected to a data input/output terminal DATA_m. In data reading, the potential of the data input/output terminal DATA_m is measured. As described above, although the phase of the potential of the reading bit line RBL_m is opposite to that of written data, a potential inverted by the flip-flop circuit FF_m (the phase of that inverted potential is the same as that of written data) is output to the writing bit line WBL_m and the data input/output terminal DATA_m.

In data writing, the potential of the data input/output terminal DATA_m is set according to the written data. Note that in a column where data is rewritten, the potential of the data input/output terminal DATA_m is preferably changed in the state where the selection transistor STr_m is turned off by setting the potential of the data selection line SL0_m to L.

For example, the case where data "1" is stored in the memory cell and is rewritten to data "0" is described. In that case, the potential of the data input/output terminal DATA_m is set to 0 V in the state where the selection transistor STr_m is off. In the state where data "1" is stored in the memory cell, a reading transistor RTr_n_m is on. Therefore, the potential of the reading bit line RBL_m is 0 V.

Note that when the potential of the data input/output terminal DATA_m is set to 0 V in the state where the selection transistor STr_m is off, the potential of the reading bit line RBL_m is kept at 0 V and current does not flow between a source and a drain of the reading transistor RTr_n_m.

An example of a driving method in the case where such a driver circuit is used will be described with reference to FIGS. 3A to 3D. As described above, writing transistors WTr of a large number of memory cells are connected to a writing word line WWL. In some cases, data needs to be written to some of the memory cells, and does not need to be written to the others. When the potential of the writing word line WWL is set to H, all the writing transistors WTr connected to the writing word line WWL are turned on, and data of the memory cell for which data writing is unnecessary might be rewritten to false one.

In a semiconductor device having the circuit illustrated in FIG. 2, to a memory cell for which data writing is unnecessary, data which is equivalent to initially stored one is written. In that case, a process in which stored data is read is needed before data writing. Here, the case where data "1" is initially stored in the memory cell in the n-th row and the m-th column is described.

Figure 3A:
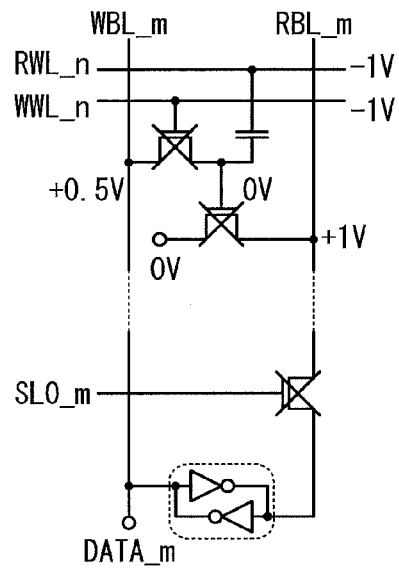
FIGS. 3A to 3D illustrate an example of a driving method of a semiconductor memory device according to the present invention.
Figure 3B:
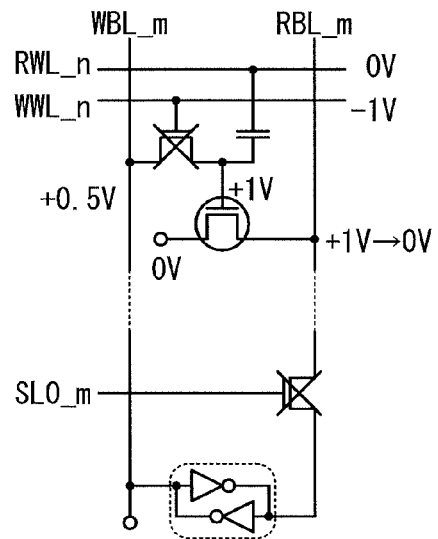
Figure 3C:
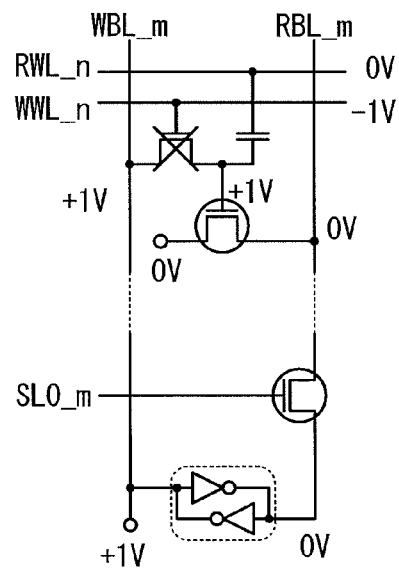

First, the writing bit line WBL_m and the reading bit line RBL_m are pre-charged to +0.5 V and +1 V, respectively (see FIG. 3A). For this, in the state where the selection transistor STr_m in FIG. 2 is off, the potential of the first pre-charge control line CL1 is set to H, and the first pre-charge transistor CTr1_m and the second pre-charge transistor CTr2_m are turned on.

Next, the potential of the reading word line RWL_n is set to 0 V. As a result, the potential of the gate of the reading transistor RTr_nm becomes +1 V, and the reading transistor RTr_n_m is turned on. The potential of the reading bit line RBL_m is decreased from +1 V to 0 V (see FIG. 3B).

After that, the potential of the data selection line SL0_m is set to H, and the selection transistor STr_m is turned on. Since the selection transistor STr_m is turned on, the potential of the reading bit line RBL_m is input to the flip-flop circuit FF_m. Here, since the potential of the reading bit line RBL_m (0 V) is lower than that of the writing bit line WBL_m (+0.5 V), the potential of the reading bit line RBL_m and that of the writing bit line WBL_m become 0 V and +1 V, respectively, by the effect of the flip-flop circuit FF_m. The potential of the data input/output terminal DATA_m connected to the writing bit line WBL_m becomes +1 V (see FIG. 3C).

In this state, when the potential of the writing word line WWL_n is set to +2 V, the writing transistor WTr_n_m is turned on and the capacitor CS_n_m is charged to +1 V. That is, data which is equivalent to initially stored one is written.

Note that in this process, although the reading transistor RTr_n_m is on, current does not flow between the source and the drain because the potential of the source and that of the drain are equal to each other (0 V).

Figure 3D:
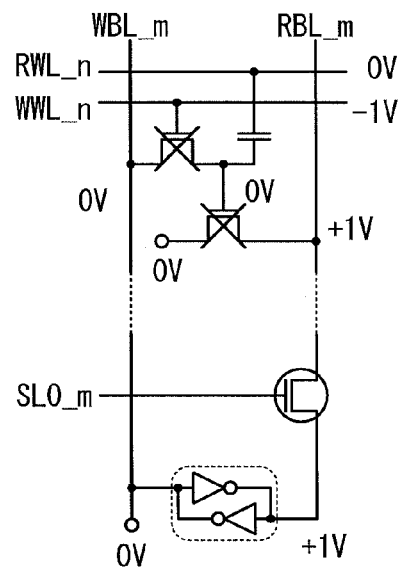

The case where data "1" is initially stored is described above; however, also in the case where data "0" is initially stored, the writing bit line WBL_m has a potential corresponding to data which is initially stored (i.e., 0 V) (see FIG. 3D).

Then, when the potential of the writing word line WWL_n is set to +2 V, the writing transistor WTr_n_m is turned on and the capacitor CS_n_m is charged to 0 V. That is, data which is equivalent to initially stored one is written.

At this time, current does not flow between the source and the drain of the reading transistor RTr_n_m. The reason is that, in this case, the potential of the reading bit line RBL_m is kept at the pre-charged potential, i.e., +1 V and there is a potential difference between the source and the drain of the reading transistor RTr_n_m, but the reading transistor RTr_n_m is off because the potential of the gate of the reading transistor RTr_n_m is 0 V.

The case where data is not rewritten is described above, and in the case where data is rewritten, the following process may be performed. First, as illustrated in FIG. 3A, the writing bit line WBL_m and the reading bit line RBL_m are pre-charged to +0.5 V and +1 V, respectively. Note that data does not need to be read; thus, in the case where pre-charge can be controlled per column, pre-charge is not performed in a column where data is rewritten, which leads to a reduction in power consumption.

After that, in the state where the selection transistor is kept off, the potential of the data input/output terminal DATA_m is set to one corresponding to data to be written. The potential of the writing bit line WBL_m is also set to one corresponding to data to be written. In this state, when the potential of the writing word line WWL_n is set to +2 V, the writing transistor WTr_n_m is turned on and the capacitor CS_n_m is charged to a potential corresponding to written data.

Embodiment 2

Figure 4:
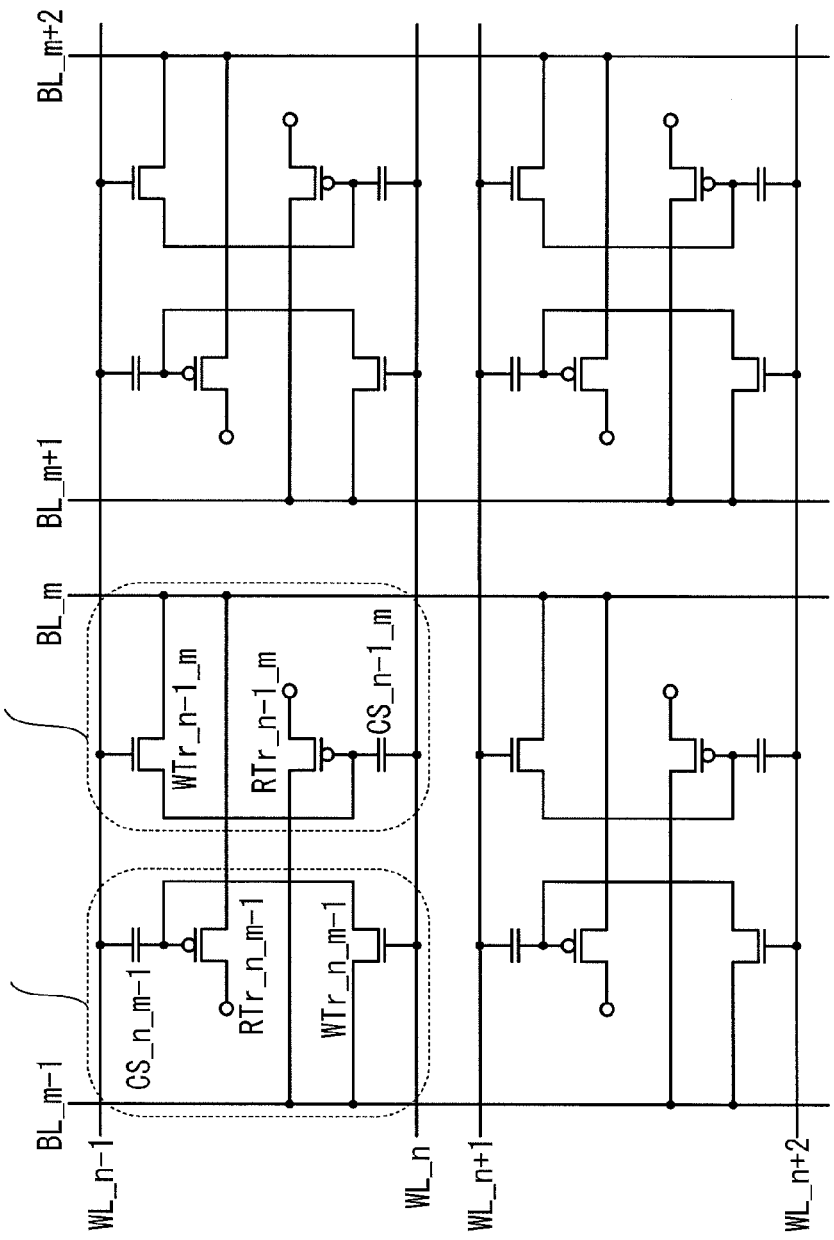
FIG. 4 illustrates an example of a semiconductor memory device according to the present invention.
Figure 5:
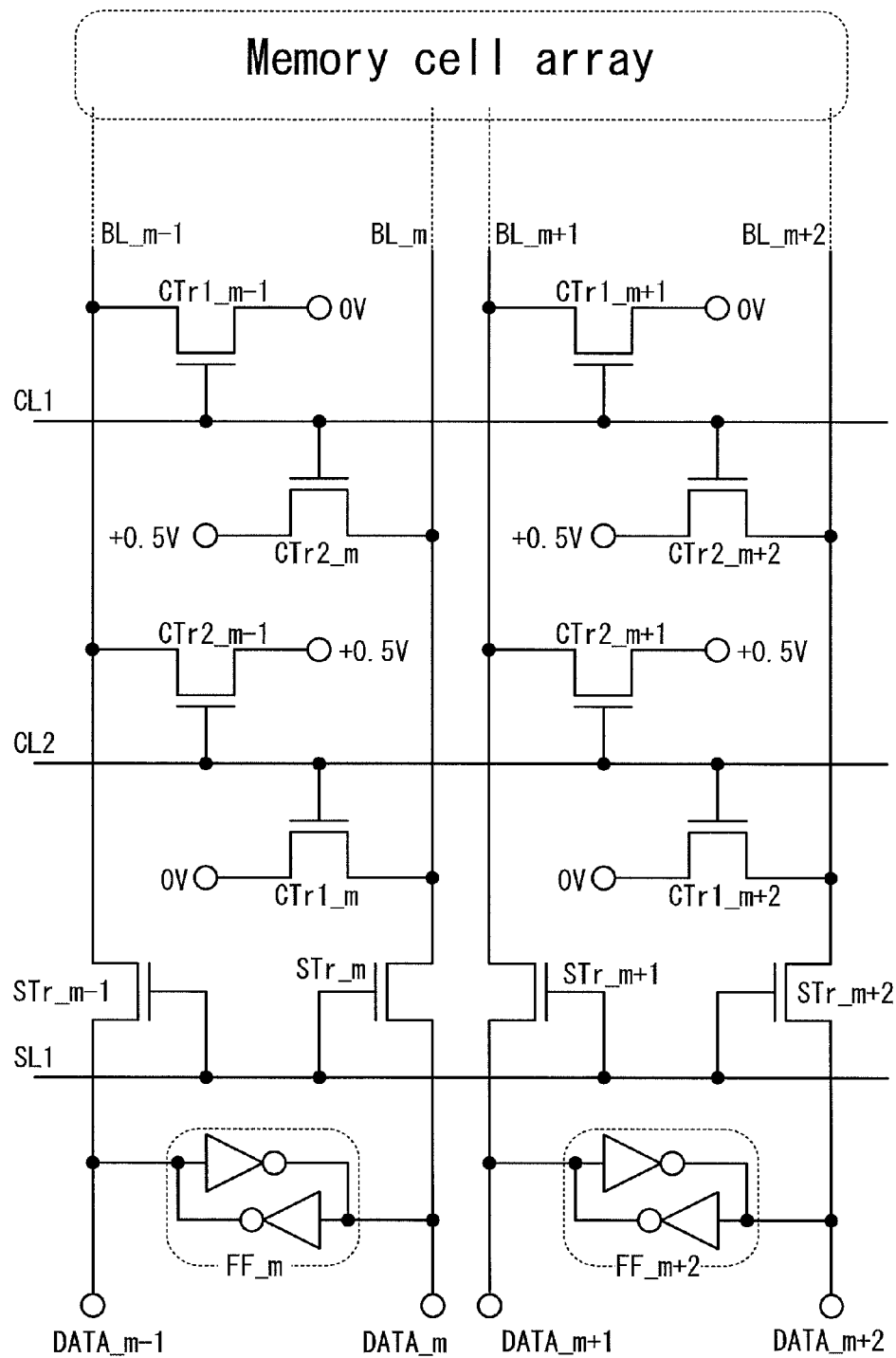
FIG. 5 illustrates an example of a semiconductor memory device according to the present invention.

FIG. 4 is a circuit diagram illustrating part of a memory cell array of a semiconductor memory device in this embodiment, and FIG. 5 is a circuit diagram illustrating part of a driver circuit of a semiconductor memory device in this embodiment. FIGS. 9A to 9E illustrate an example of a driving method of a semiconductor memory device in this embodiment.

In the semiconductor memory device in this embodiment, as illustrated in FIG. 4, a plurality of memory cells including a memory cell in the (n−1)-th row and the m-th column, a memory cell in the n-th row and the (m−1)-th column, and the like are arranged in a matrix. Here, n and m are each an even number of 2 or more.

In the memory cell in the n-th row and the (m−1)-th column, a source of a writing transistor WTr_n_m−1, a gate of a reading transistor RTr_n_m−1, and one electrode of a capacitor CS_n_m−1 are connected to each other. In the memory cell in the (n−1)-th row and the m-th column, a source of a writing transistor WTr_n−1_m, a gate of a reading transistor RTr_n−1_m, and one electrode of a capacitor CS_n−1_m are connected to each other.

Here, as the writing transistor WTr, a transistor whose characteristics are similar to those of the writing transistor WTr in Embodiment 1 may be used. As the reading transistor RTr, a transistor having the opposite conductivity type (here, a p-channel transistor) to the writing transistor WTr is used.

A gate of the writing transistor WTr_n_m−1 and the other electrode of the capacitor CS_n−1_m are connected to a word line WL_n in the n-th row. A of the writing transistor WTr_n−1_m and the other electrode of the capacitor CS_n_m−1 are connected to a word line WL_n−1 in the (n−1)-th row. A drain of the writing transistor WTr_n_m−1 and a drain of the reading transistor RTr_n−1_m are connected to a bit line BL_m−1 in the (m−1)-th column. A drain of the writing transistor WTr_n−1_m and a drain of the reading transistor RTr_n_m−1 are connected to a bit line BL_m in the m-th column.

The word line WL in FIG. 4 functions as the writing word line WWL and the reading word line RWL in FIGS. 1A to 1E. The bit line BL in FIG. 4 functions as the writing bit line WBL and the reading bit line RBL in FIGS. 1A to 1E. Therefore, the number of wirings can be reduced, and the degree of integration can be increased.

Specifically, for the memory cell in the n-th row and the (m−1)-th column, the word line WL_n, the word line WL_n−1, the bit line BL_m−1, and the bit line BL_m correspond to the writing word line WWL_n, the reading word line RWL_n, the writing bit line WBL_m, and the reading bit line RBL_m in FIGS. 1A to 1E, respectively.

FIG. 5 illustrates part of a circuit for driving the memory cell array in FIG. 4. A drain of a first pre-charge transistor CTr1_m−1 and a drain of a second pre-charge transistor CTr2_m−1 are connected to a bit line BL_m−1. A drain of a first pre-charge transistor CTr1_m and a drain of a second pre-charge transistor CTr2_m are connected to a bit line BL_m.

Similarly, a drain of a first pre-charge transistor CTr1_m+1 and a drain of a second pre-charge transistor CTr2_m+1 are connected to a bit line BL_m+1, and a drain of a first pre-charge transistor CTr1_m+2 and a drain of a second pre-charge transistor CTr2_m+2 are connected to a bit line BL_m+2.

A gate of the first pre-charge transistor CTr1_m−1 and a gate of the second pre-charge transistor CTr2_m are connected to a first pre-charge control line CL1, and operate in conjunction with each other. Similarly, a gate of the second pre-charge transistor CTr2_m−1 and a gate of the first pre-charge transistor CTr1_m are connected to a second pre-charge control line CL2.

Similarly, a gate of the first pre-charge transistor CTr1_m+1 and a gate of the second pre-charge transistor CTr2_m+2 are connected to the first pre-charge control line CL1, and operate in conjunction with each other. Similarly, a gate of the second pre-charge transistor CTr2_m+1 and a gate of the first pre-charge transistor CTr1_m+2 are connected to the second pre-charge control line CL2.

Note that the potentials of sources of the first pre-charge transistors CTr1_m−1, CTr1_m, CTr1_m+1, and CTr1_m+2 are kept at 0 V, and the potentials of sources of the second pre-charge transistors CTr2_m−1, CTr2_m, CTr2_m+1, and CTr2_m+2 are kept at +0.5 V.

Therefore, when the potential of the first pre-charge control line CL1 is set to H, the potentials of the bit lines BL_m−1 and BL_m+1 become 0 V and the potentials of the bit lines BL_m and BL_m+2 become +0.5 V. When the potential of the second pre-charge control line CL2 is set to H, the potentials of the bit lines BL_m−1 and BL_m+1 become +0.5 V and the potentials of the bit lines BL_m and BL_m+2 become 0V.

Drains of selection transistors STr_m−1 and STr_m are connected to the bit lines BL_m−1 and BL_m, respectively. Sources of the selection transistors STr_m−1 and STr_m are connected to two input terminals of a flip-flop circuit FF_m, respectively. The sources of the selection transistors Str_m−1 and STr_m are also connected to data input/output terminals DATA_m−1 and DATA_m, respectively.

Similarly, drains of selection transistors STr_m+1 and STr_m+2 are connected to the bit lines BL_m+1 and BL_m+2, respectively. Sources of the selection transistors STr_m+1 and STr_m+2 are connected to two input terminals of a flip-flop circuit FF_m+2, respectively. The sources of the selection transistors Str_m+1 and STr_m+2 are also connected to data input/output terminals DATA_m+1 and DATA_m+2, respectively.

Gates of the selection transistors STr_m−1, STr_m, STr_m+1, and STr_m+2 are connected to a first data selection line SL1; thus, when the potential of the first data selection line SL1 is set to H, the selection transistors STr_m−1, STr_m, STr_m+1, and STr_m+2 can be turned on. In such a manner, the bit line BL and the flip-flop circuit FF can be connected to each other. The high power supply potential of the flip-flop circuit FF is assumed to be +1 V and the low power supply potential of the flip-flop circuit FF is assumed to be 0 V.

An operation example of such a circuit will be described with reference to FIGS. 9A to 9E. Here, an example of operation of the memory cell in the (n−1)-th row and the m-th column and the memory cell in the n-th row and the (m−1)-th column will be described. In the operation described below, the potential of the bit line BL is higher than or equal to 0 V. The threshold voltage of the writing transistor WTr is assumed to be +1 V, and the threshold voltage of the reading transistor RTr is assumed to be −0.5 V. Note that the potential of the source of the reading transistor RTr is kept at a constant potential (here, +1 V) in the operation described below.

Figure 9A:
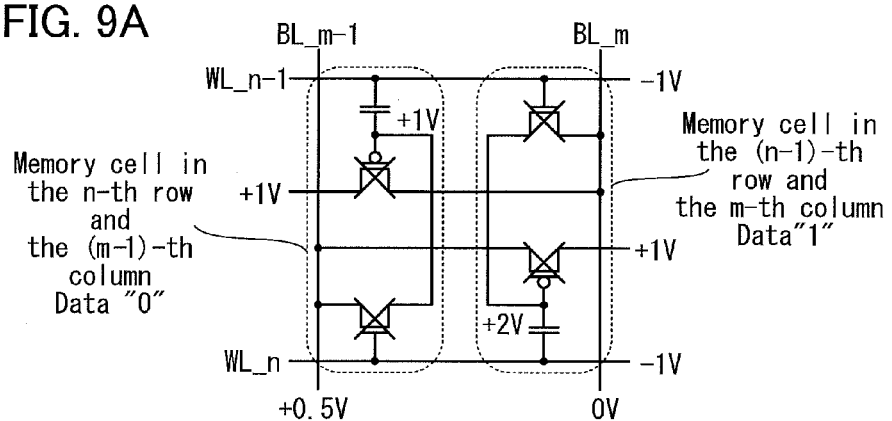
FIGS. 9A to 9E illustrate an example of a driving method of a semiconductor memory device according to the present invention.
Figure 9B:
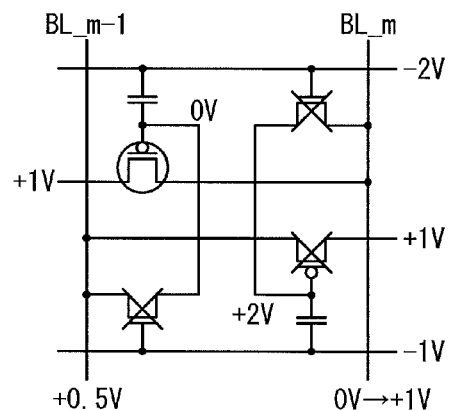
Figure 9C:
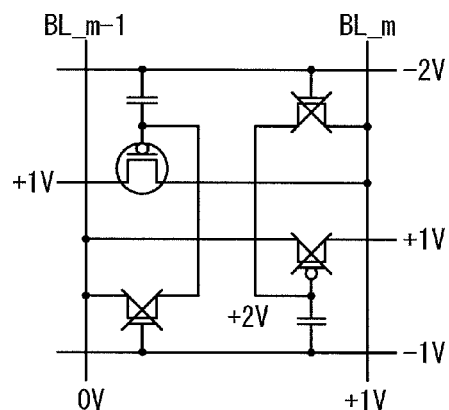

First, reading operation will be described. The case where data "1" is initially stored in the memory cell in the (n−1)-th row and the m-th column and data "0" is initially stored in the memory cell in the n-th row and the (m−1)-th column is described. In a holding state, as illustrated in FIG. 9A, the potential of the word line WL_n−1 and that of the word line WL_n are assumed to be −1 V. As described below, since the potential of the word line WL connected to the capacitor CS at the time of data writing is −2 V, the potential of the gate of the reading transistor RTr in the memory cell where data "1" has been stored is +2 V, and that in the memory cell where data "0" has been stored is +1 V.

Therefore, as illustrated in FIG. 9A, the potential of the gate of the reading transistor RTr_n_m−1 is +1 V, the potential of the gate of the reading transistor RTr_n−1_m is +2 V, and both of the reading transistors are off. Further, the writing transistors WTr_n−1_m and WTr_n_m−1 are also off.

Before data in the memory cell in the n-th row and the (m−1)-th column is read, as illustrated in FIG. 9A, the bit line BL_m−1 and the bit line BL_m are pre-charged to +0.5 V and 0 V, respectively. For this, the potential of the second pre-charge control line CL2 in FIG. 5 may be set to H.

Next, the potential of the word line WL_n−1 is set to −2 V. As a result, the potential of the gate of the reading transistor RTr_n_m−1 becomes 0 V, and the reading transistor RTr_n_m−1 is turned on. Then, charge is supplied from the source of the reading transistor RTr_n_m−1 to the bit line BL_m, so that the potential of the bit line BL_m is increased from 0 V to +1 V (see FIG. 9B).

Here, the potential of the first data selection line SL1 in FIG. 5 is set to H and the flip-flop circuit FF_m is connected to the bit lines BL_m−1 and BL_m. In that case, the potential of the input terminal of the flip-flop circuit FF_m, which is connected to the bit line BL_m having a higher potential, becomes a higher potential (+1 V). Further, the potential of the input terminal of the flip-flop circuit FF_m, which is connected to the bit line BL_m−1 having a lower potential, becomes a lower potential (0 V). As a result, the data input/output terminal DATA_m−1 has a potential corresponding to data in the memory cell in the n-th row and the (m−1)-th column (i.e., 0 V) (see FIG. 9C).

The case where data "0" has been stored in the memory cell in the n-th row and the (m−1)-th column is described above. Further, also in the case where data "1" has been stored, the data input/output terminal DATA_m−1 has a potential corresponding to data in the memory cell (i.e., +1 V). That is to say, in that case, in the above process, the reading transistor RTr_n_m−1 (the potential of the gate is +1 V) remains off, and the potential of the bit line BL_m is kept at 0 V and is lower than that of the bit line BL_m−1 (+0.5 V); therefore, owing to the operation of the flip-flop circuit FF_m, the potential of the bit line BL_m becomes 0 V and the potential of the bit line BL_m−1 (i.e., the potential of the data input/output terminal DATA_m−1) becomes +1 V.

The reading operation is thus completed. Next, writing operation will be described. As in Embodiment 1, data reading is performed before data writing. The process thereof is as described above.

Figure 9D:
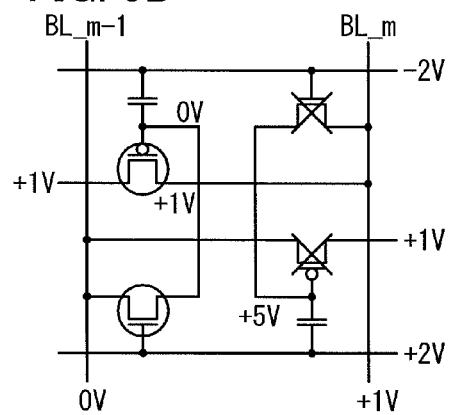

If data in the memory cell in the n-th row and the (m−1)-th column does not need to be rewritten, the potential of the word line WL_n is set to +2 V. Then, the writing transistor WTr_n_m−1 is turned on, and the potential of the capacitor CS_n_m−1 becomes 0 V as illustrated in FIG. 9D. At this time, although the reading transistor RTr_n_m−1 is on, current does not flow between the source and the drain because both the potential of the source and that of the drain are +1 V.

Figure 9E:
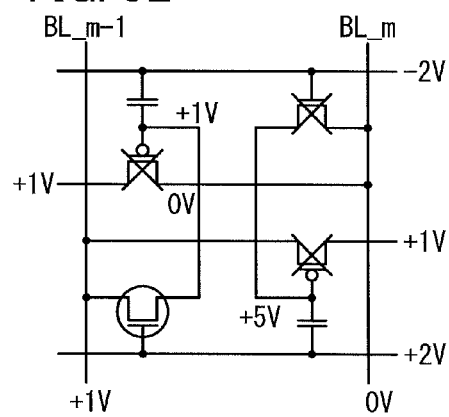

In the case where data "1" has been stored in the memory cell in the n-th row and the (m−1)-th column, although the potential of the drain of the reading transistor RTr_n_m−1 (the potential of the bit line BL_m) is 0 V and is different from that of the source (+1 V), current does not flow between the source and the drain because the reading transistor RTr_n_m−1 is off (see FIG. 9E).

If data in the memory cell in the n-th row and the (m−1)-th column is rewritten, in the state where the potential of the word line WL_n is set to +2 V and the writing transistor WTr_n_m−1 is turned on, the data input/output terminal DATA_m−1 in FIG. 5 may have a potential corresponding to rewritten data. At this time, when the data input/output terminal DATA_m has a potential corresponding to data which is inverted from data to be written (that is, it has a potential of +1 V in the case where data "0" is to be written, and it has a potential of 0 V in the case where data "1" is to be written), data writing can be performed stably.

Embodiment 3

In this embodiment, examples of a layout and a manufacturing method of the semiconductor memory device described in Embodiment 2 will be described with reference to FIGS. 6A to 6D, FIGS. 7A to 7C, and FIGS. 8A to 8F. FIGS. 6A to 6D and FIGS. 7A to 7C are cross-sectional views illustrating a manufacturing process, and FIGS. 8A to 8F illustrate a layout of components such as main wirings and the like in main layers. Note that line A-B denotes the same position through FIGS. 8A to 8F. Further, dotted lines in FIGS. 8A to 8F denote coordinates, and can be used as reference when a positional relationship between structures in different layers is referred to.

Figure 8A:
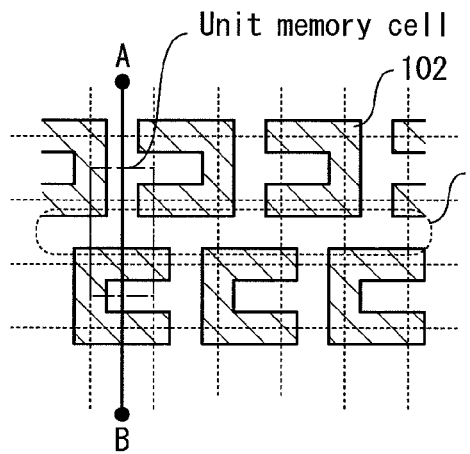
FIGS. 8A to 8F illustrate an example of a semiconductor memory device according to the present invention.

FIG. 8A illustrates shapes of element isolation insulators 102 provided over a semiconductor substrate. The element isolation insulators 102 have a C-like shape. A continuous region 101a is formed in a direction intersecting with line A-B in the drawing, and this region is to be an impurity region 104a functioning as a wiring. The unit memory cell of the semiconductor memory device described in this embodiment occupies a region denoted by dashed-dotted line in FIG. 8A.

Figure 8B:
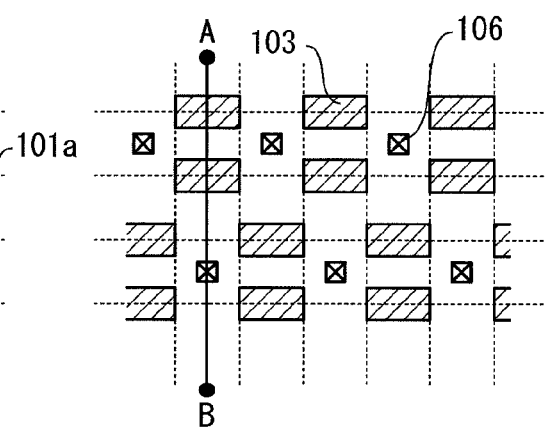

FIG. 8B illustrates a layout of floating gates 103 and first contact holes 106. The first contact holes 106 are each provided in the center of the C-like shape of the element isolation insulator 102. Each of the floating gates 103 is provided so as to overlap with two element isolation insulators.

Figure 8C:
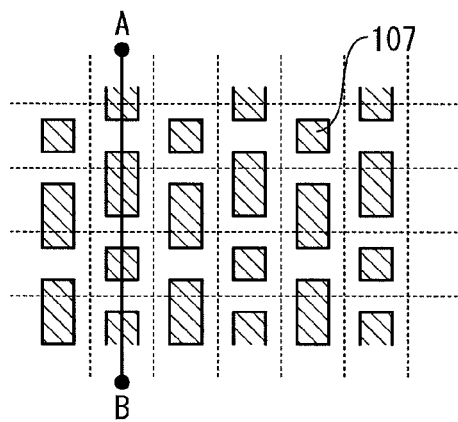
Figure 8D:
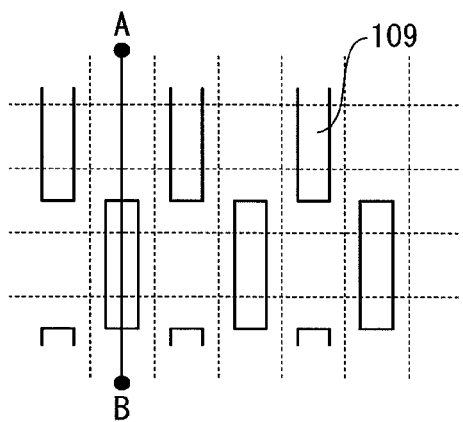
Figure 8E:
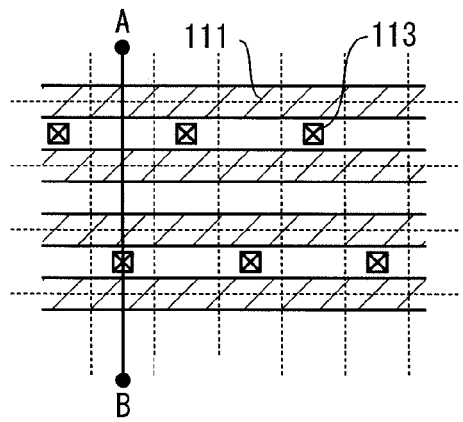
Figure 8F:
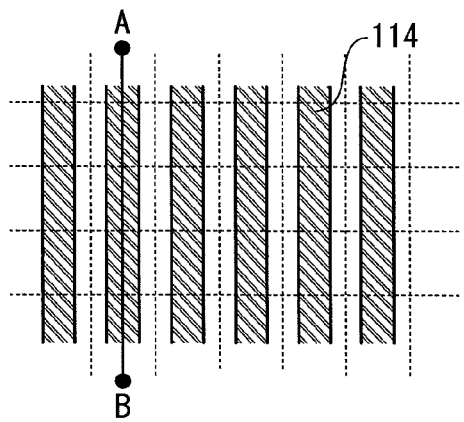

FIG. 8C illustrates a layout of interlayer wirings 107 provided in contact with the floating gates 103 and the first contact holes 106. FIG. 8D illustrates a layout of oxide semiconductor layers 109 provided in contact with the interlayer wirings 107. FIG. 8E illustrates a layout of word lines 111 and second contact holes 113. FIG. 8F illustrates a layout of bit lines 114. The second contact holes 113 may be provided in the substantially same positions as the respective first contact holes 106.

A manufacturing process of a semiconductor memory device having the layout structure illustrated in FIGS. 8A to 8F will be described below with reference to FIGS. 6A to 6D and FIGS. 7A to 7C. Note that FIGS. 6A to 6D and FIGS. 7A to 7C are cross-sectional views taken along line A-B in FIGS. 8A to 8F.

<FIG. 6A>

Figure 6A:
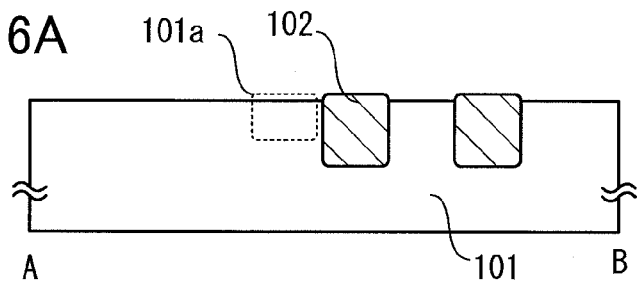
FIGS. 6A to 6D illustrate an example of a manufacturing process of a semiconductor memory device according to the present invention.
Figure 6B:
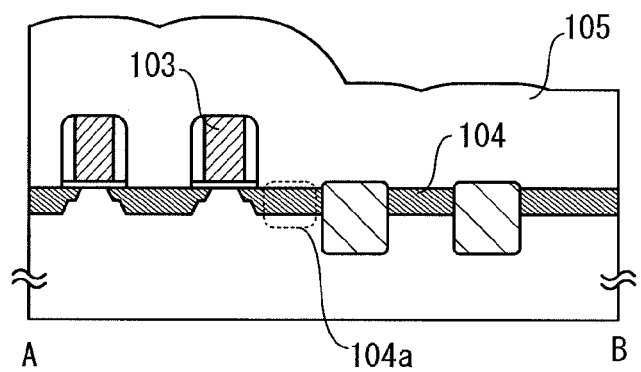
Figure 6C:
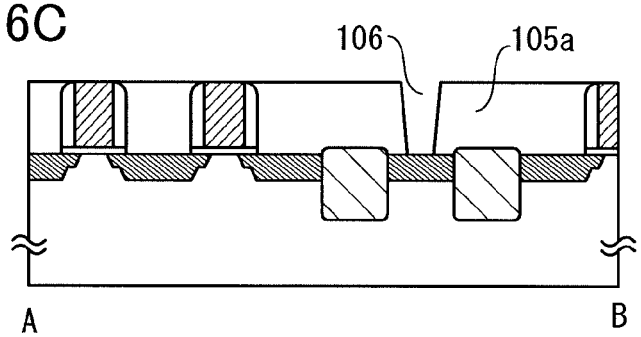
Figure 6D:
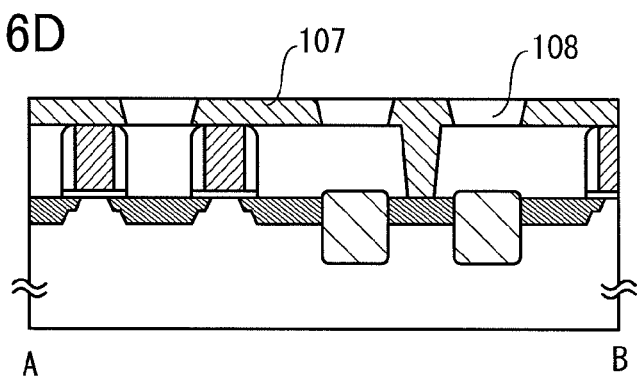

By a known semiconductor processing technique, the element isolation insulator 102 is formed on one surface of a substrate 101 of a single crystal semiconductor such as silicon or gallium arsenide. As described above, the region 101a denoted by dotted line in FIG. 6A is to be the impurity region 104a functioning as a wiring.

<FIG. 6B>

By a known semiconductor processing technique, the floating gate 103 and a p-type impurity region 104 are formed. In addition, a first interlayer insulator 105 is formed. Note that part of the p-type impurity region 104 (denoted by dotted line in FIG. 6B) is the impurity region 104a functioning as a wiring. The impurity region 104a functioning as a wiring extends in a direction intersecting with line A-B (that is, a direction of the word line 111).

<FIG. 6C>

The first interlayer insulator 105 is planarized by a means such as chemical mechanical polishing (CMP). This planarization may be stopped in the state where the floating gate 103 is exposed. A planarized first interlayer insulator 105a is obtained in this manner. Further, the planarized first interlayer insulator 105a is etched, whereby the first contact hole 106 is formed.

<FIG. 6D>

The interlayer wiring 107 and an embedded insulator 108 are formed. A forming method of the first interlayer insulator may be referred to for a forming method of the embedded insulator 108, and planarization treatment may be performed so as to expose a surface of the interlayer wiring 107. The embedded insulator 108 is preferably formed using silicon oxide. The thickness of the embedded insulator 108 is 100 nm to 500 nm, and in a region having a thickness of 100 nm from a surface of the embedded insulator 108, the hydrogen concentration may be lower than $1 \times 10^{18}$ cm$^{-3}$, preferably lower than $1 \times 10^{-17}$ cm$^{-3}$.

<FIG. 7A>

The oxide semiconductor layer 109 and a gate insulator 110 covering the oxide semiconductor layer 109 are formed. For the oxide semiconductor layer 109, an oxide semiconductor in which indium accounts for 20 at % or more of all metal elements is preferably used. The thickness thereof is 1 nm to 20 nm, preferably 1 nm to 10 nm. As for dispersion in thickness, the root-mean-square (RMS) may be set to 0.01 nm to 1 nm.

At the time of formation of the oxide semiconductor layer 109, attention needs to be paid to prevent mixture of hydrogen, and deposition of the oxide semiconductor is preferably performed by a sputtering method in which hydrogen and water in an atmosphere and a target are sufficiently reduced. The hydrogen concentration in the oxide semiconductor layer 109 may be lower than $1 \times 10^{18}$ cm$^{-3}$, preferably lower than $1 \times 10^{-17}$ cm$^{-3}$. Note that Patent Document 2 can be referred to for the oxide semiconductor layer 109 and a forming method thereof.

As a material for the gate insulator 110, silicon oxide, silicon oxynitride, aluminum oxide, hafnium oxide, zirconium oxide, or the like can be used. The thickness thereof is 6 nm to 20 nm, preferably 10 nm to 16 nm. As for dispersion in thickness, the root-mean-square (RMS) may be set to 0.01 nm to 1 nm. The hydrogen concentration in the gate insulator 110 may be lower than $1 \times 10^{18}$ cm$^{-3}$, preferably lower than $1 \times 10^{-17}$ cm$^{-3}$.

<FIG. 7B>

The word line 111 is formed. As a material for the word line 111, a material whose work function is larger than the electron affinity of the oxide semiconductor, such as tungsten, tungsten nitride, platinum, palladium, nickel, or indium nitride, is preferably used. Alternatively, only part of the word line 111, which is in contact with the gate insulator 110, may be formed using such a material.

Further, the second interlayer insulator 112 is formed, and the second interlayer insulator 112, the gate insulator 110, and the oxide semiconductor layer 109 are etched. Thus, the second contact hole 113 is formed.

<FIG. 7C>

Figure 7A:
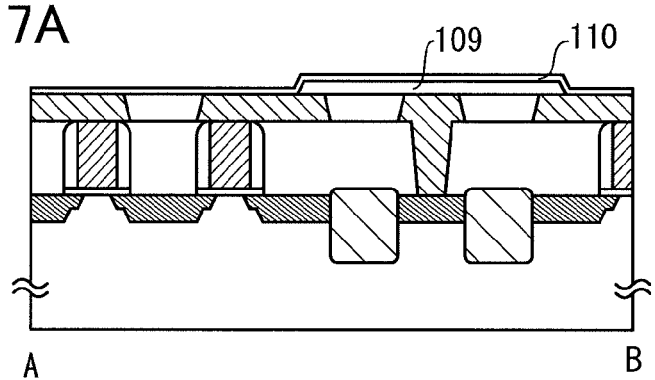
FIGS. 7A to 7C illustrate an example of a manufacturing process of a semiconductor memory device according to the present invention.
Figure 7B:
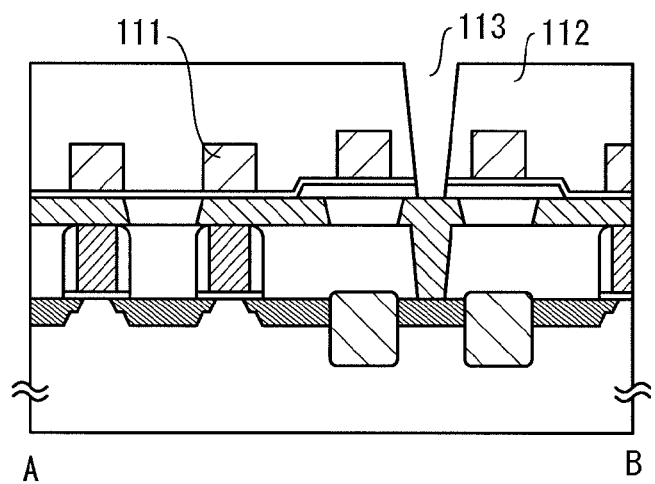
Figure 7C:
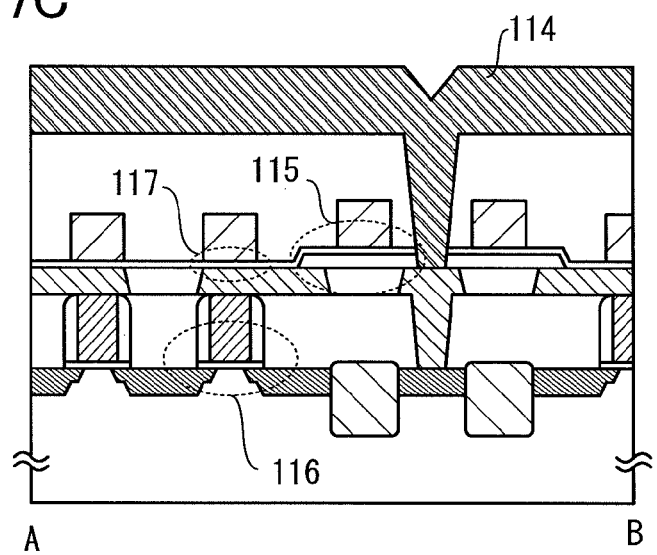

The bit line 114 is formed. Thus, a writing transistor 115, a reading transistor 116, and a capacitor 117 can be formed. As illustrated in FIG. 7C, in the memory cell described in this embodiment, most of a portion where the oxide semiconductor layer 109 and the word line 111 overlap with each other (a channel portion of the writing transistor 115) is formed over the element isolation insulator 102.

If the channel portion of the writing transistor 115 is formed over the impurity region 104, the writing transistor 115 is turned on or substantially turned on due to a change in potential of the impurity region 104; however, such a problem does not occur by employing the layout described in this embodiment. That is, even when the planarized first interlayer insulator 105a and embedded insulator 108 each have a small thickness of 200 nm or less, charge holding operation of the memory cell is not affected.

When F is used to express the minimum feature size, the area of one memory cell in the semiconductor memory device disclosed in this embodiment can be expressed as $8F^2$, which means that this semiconductor memory device has the same degree of integration as a DRAM. In addition, a capacitor having large capacitance is unnecessary unlike in a DRAM. With the use of a writing transistor in which the amount of current flowing between a source and a drain in an off state is extremely small as described above, the interval between refresh operations can be sufficiently long, or the refresh operation can be substantially unnecessary.

Although an oxide semiconductor is employed as the semiconductor used in the writing transistor in the above example, another kind of semiconductor may be alternatively used. For example, a polycrystalline silicon film which is formed by laser crystallization or a single crystal silicon film may be used.

Embodiment 4

In Embodiment 1 and Embodiment 2, the writing bit line WBL_m or the bit line BL_m−1 is pre-charged to +0.5 V at the time of data reading; in this embodiment, an example of a driving method in which such pre-charge is unnecessary and an example of a driver circuit therefor will be described. Since pre-charge operation is unnecessary, power consumption can be reduced.

Figure 10:
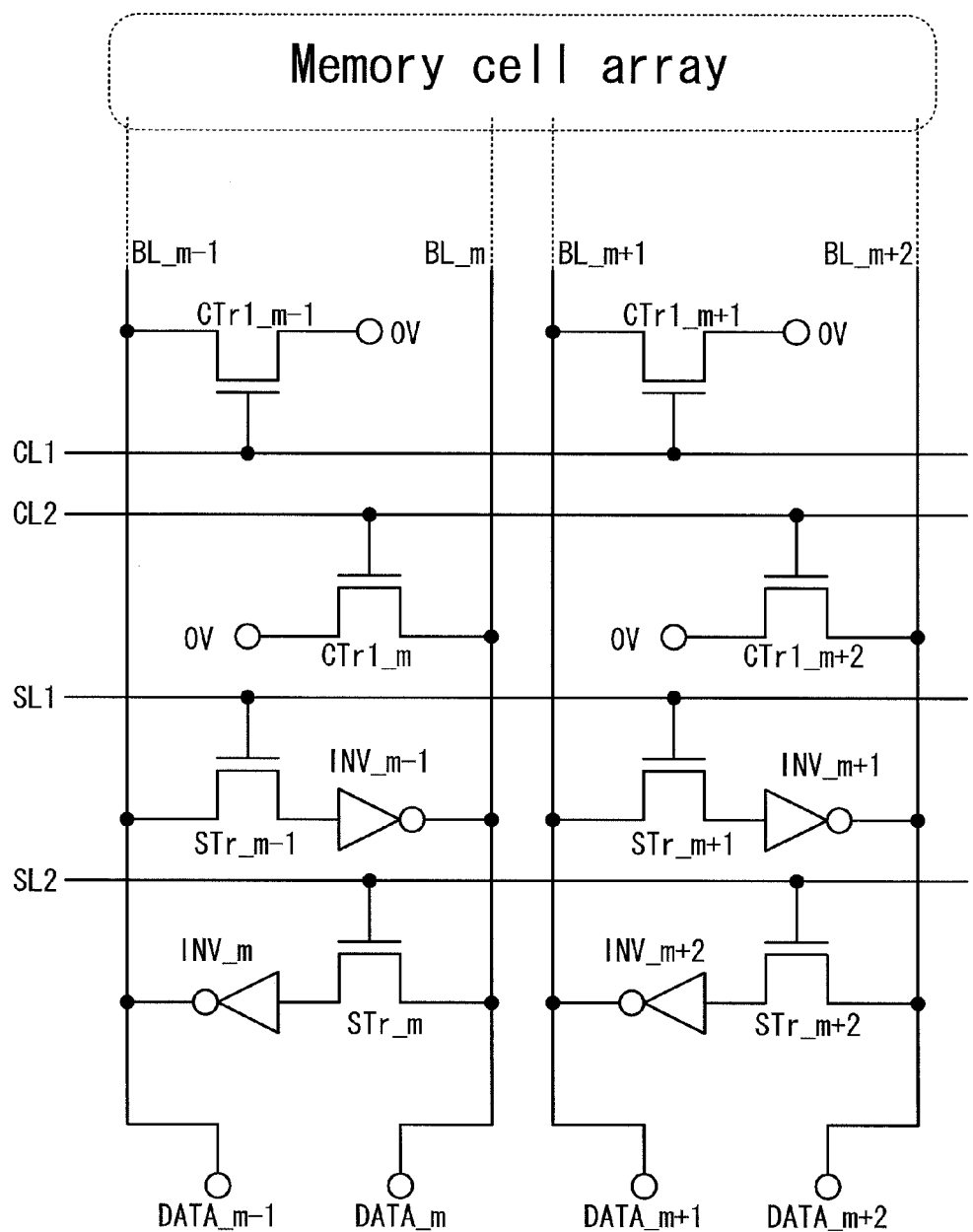
FIG. 10 illustrates an example of a semiconductor memory device according to the present invention.

FIG. 10 illustrates part of a driver circuit of a semiconductor memory device used in this embodiment. Here, m is an even number of 2 or more. The memory cell array illustrated in FIG. 4 is used. To each bit line BL, a drain of a first pre-charge transistor CTr1 for pre-charging the bit line BL to 0 V is connected. Sources of the first pre-charge transistors CTr1 are kept at +1 V. Gates of the first pre-charge transistors CTr1 in odd-numbered columns are connected to a first pre-charge control line CL1, and gates thereof in even-numbered columns are connected to a second pre-charge control line CL2.

That is, when the potential of the first pre-charge control line CL1 is set to H, the bit lines in the odd-numbered columns are pre-charged to 0 V; when the potential of the second pre-charge control line CL2 is set to H, the bit lines in the even-numbered columns are pre-charged to 0 V.

The bit line BL_m−1 is connected to a drain of a selection transistor STr_m−1 and an output terminal of an inverter INV_m, and a source of the selection transistor STr_m−1 is connected to an input terminal of an inverter INV_m−1.

On the other hand, the bit line BL_m is connected to a drain of a selection transistor STr_m and an output terminal of the inverter INV_m−1, and a source of the selection transistor STr_m is connected to an input terminal of the inverter INV_m. Note that the high power supply potential of the inverter is assumed to be +1 V, and the low power supply potential thereof is assumed to be 0 V.

A gate of the selection transistor STr_m−1 is connected to a first data selection line SL1, and a gate of the selection transistor STr_m is connected to a second data selection line SL2. Therefore, when the potential of the first data selection line SL1 is set to H, the selection transistor STr_m−1 is turned on; when the potential of the second selection line SL2 is set to H, the selection transistor STr_m is turned on.

In a similar manner, the bit line BL_m+1, the bit line BL_m+2, a selection transistor STr_m+1, a selection transistor STr_m+2, the first data selection line SL1, the second data selection line SL2, an inverter INV_m+1, and an inverter_m+2 also form the above connection relations. Note that each bit line BL is connected to a data input/output terminal DATA.

Data reading is performed as follows. For example, in reading data of a memory cell in the n-th row and the (m−1)-th column, the m-th column is pre-charged to 0 V first. This operation can be performed as described above by setting the potential of the second pre-charge control line CL2 to H to turn on the first pre-charge transistor.

Next, the potential of the word line WL_n−1 is set to −2 V as described in Embodiment 2, whereby the state of a reading transistor RT_n_m−1 is changed. When data "1" is stored in the memory cell, the potential of the bit line BL_m is not changed because the reading transistor RT_n_m−1 is off; however, when data "0" is stored in the memory cell, the potential of the bit line BL_m is increased from 0 V to +1 V because the reading transistor RT_n_m−1 is turned on.

Then, the potential of the second data selection line SL2 in FIG. 10 is set to H, whereby the selection transistor STr_m is turned on. As a result, the potential of the bit line BL_m is input to the inverter INV_m. From the inverter INV_m, a potential whose phase is inverted from that of the potential of the bit line BL_m is output to the bit line BL_m−1. That is, the potential of the bit line BL_m−1 becomes +1 V when the potential of the bit line BL_m is 0 V, and the potential of the bit line BL_m−1 becomes 0 V when the potential of the bit line BL_m is +1 V.

In data reading, the potential of the data input/output terminal DATA_m−1 at this time may be read. Further, in the case where data writing is performed and data in the memory cell does not need to be rewritten, a writing transistor WTr_n_m−1 may be turned on by setting the potential of a word line WL_n to +2 V.

On the other hand, in the case where data writing is performed and data in the memory cell is rewritten, after the writing transistor WTr_n_m−1 is turned on, the potential of the data input/output terminal DATA_m−1 in FIG. 10 may be set to one corresponding to rewritten data, or may be set to one corresponding to data which is inverted from data to be written (that is, it may be set to a potential of +1 V in the case where data "0" is to be written, and it may be set to a potential of 0 V in the case where data "1" is to be written).

This application is based on Japanese Patent Application serial no. 2010-249435 filed with Japan Patent Office on Nov. 8, 2010, the entire contents of which are hereby incorporated by reference.

What is claimed is:
1. A semiconductor memory device comprising:
a first bit line and a second bit line;
a first word line and a second word line;
a first memory cell and a second memory cell;
an inverting amplifier circuit configured to supply an inverted and amplified potential of the second bit line to the first bit line or an inverted and amplified potential of the first bit line to the second bit line;

a first switch provided between the first bit line and a first input terminal of the inverting amplifier circuit; and a second switch provided between the second bit line and a second input terminal of the inverting amplifier circuit, wherein each of the first memory cell and the second memory cell comprises a writing transistor, a reading transistor, and a capacitor comprising a first electrode and a second electrode, wherein one of a source and a drain of the writing transistor of the first memory cell, a gate of the reading transistor of the first memory cell, and the first electrode of the capacitor of the first memory cell are connected to each other, wherein one of a source and a drain of the writing transistor of the second memory cell, a gate of the reading transistor of the second memory cell, and the first electrode of the capacitor of the second memory cell are connected to each other, wherein the other of the source and the drain of the writing transistor of the first memory cell is connected to the first bit line, wherein the other of the source and the drain of the writing transistor of the second memory cell is connected to the second bit line, wherein a gate of the writing transistor of the first memory cell is connected to the second word line, wherein a gate of the writing transistor of the second memory cell is connected to the first word line, wherein one of a source and a drain of the reading transistor of the first memory cell is connected to the second bit line, wherein one of a source and a drain of the reading transistor of the second memory cell is connected to the first bit line, wherein the second electrode of the capacitor of the first memory cell is connected to the first word line, and wherein the second electrode of the capacitor of the second memory cell is connected to the second word line.

2. A driving method of the semiconductor memory device according to claim 1, comprising the steps of:

pre-charging the first bit line and the second bit line to different potentials;

changing a potential of the first word line; and outputting a potential whose phase is opposite to a phase of a potential of the second bit line to the first bit line with the inverting amplifier circuit.

3. The semiconductor memory device according to claim 1, wherein the writing transistor and the reading transistor are provided in different layers.

4. The semiconductor memory device according to claim 1, wherein a kind of semiconductor used in the writing transistor and a kind of semiconductor used in the reading transistor are different from each other.

5. The semiconductor memory device according to claim 1, wherein the inverting amplifier circuit is a flip-flop circuit.

6. The semiconductor memory device according to claim 1, wherein the inverting amplifier circuit is an inverter.

* * * * *